United States Patent [19]
Bright

[11] 4,365,108
[45] Dec. 21, 1982

[54] SECONDARY POWER PEDESTAL FOR ELECTRICAL EQUIPMENT

[76] Inventor: William L. Bright, 900 Portway Ave., Hood River, Oreg. 97031

[21] Appl. No.: 281,916

[22] Filed: Jul. 9, 1981

[51] Int. Cl.³ .............................................. H05K 5/02
[52] U.S. Cl. ...................................... 174/50; 174/37; 52/169.9
[58] Field of Search ...................... 174/37, 48, 50, 38; 52/169.6, 169.8, 169.9

[56] References Cited

U.S. PATENT DOCUMENTS

| | | | |
|---|---|---|---|
| 2,420,478 | 5/1947 | Hasselhorn et al. | 174/37 X |
| 3,617,608 | 11/1971 | Wisniewski | 174/37 |
| 3,868,040 | 2/1975 | Langmack et al. | 174/37 X |
| 4,158,102 | 6/1979 | Bright | 174/37 X |

Primary Examiner—A. T. Grimley
Attorney, Agent, or Firm—Eugene M. Eckelman

[57] ABSTRACT

A tubular housing and cover therefor, forming a secondary power pedestal, have a tapered construction and are arranged to nest together in shipment, storage and handling. The lower end of the housing is open and has substantially straight walls at its lower end to provide such nesting with the cover. The opposite sides of the housing adjacent the bottom are slotted and are arranged to receive a pair of side strips capable of being held in the slots by a pair of connecting strips combining with the side strips to form a ground anchor flange. The connecting strips are of a structure facilitating their use as a ground anchor stake in the event that a ground anchor stake is to be used rather than a ground anchor flange.

5 Claims, 3 Drawing Figures

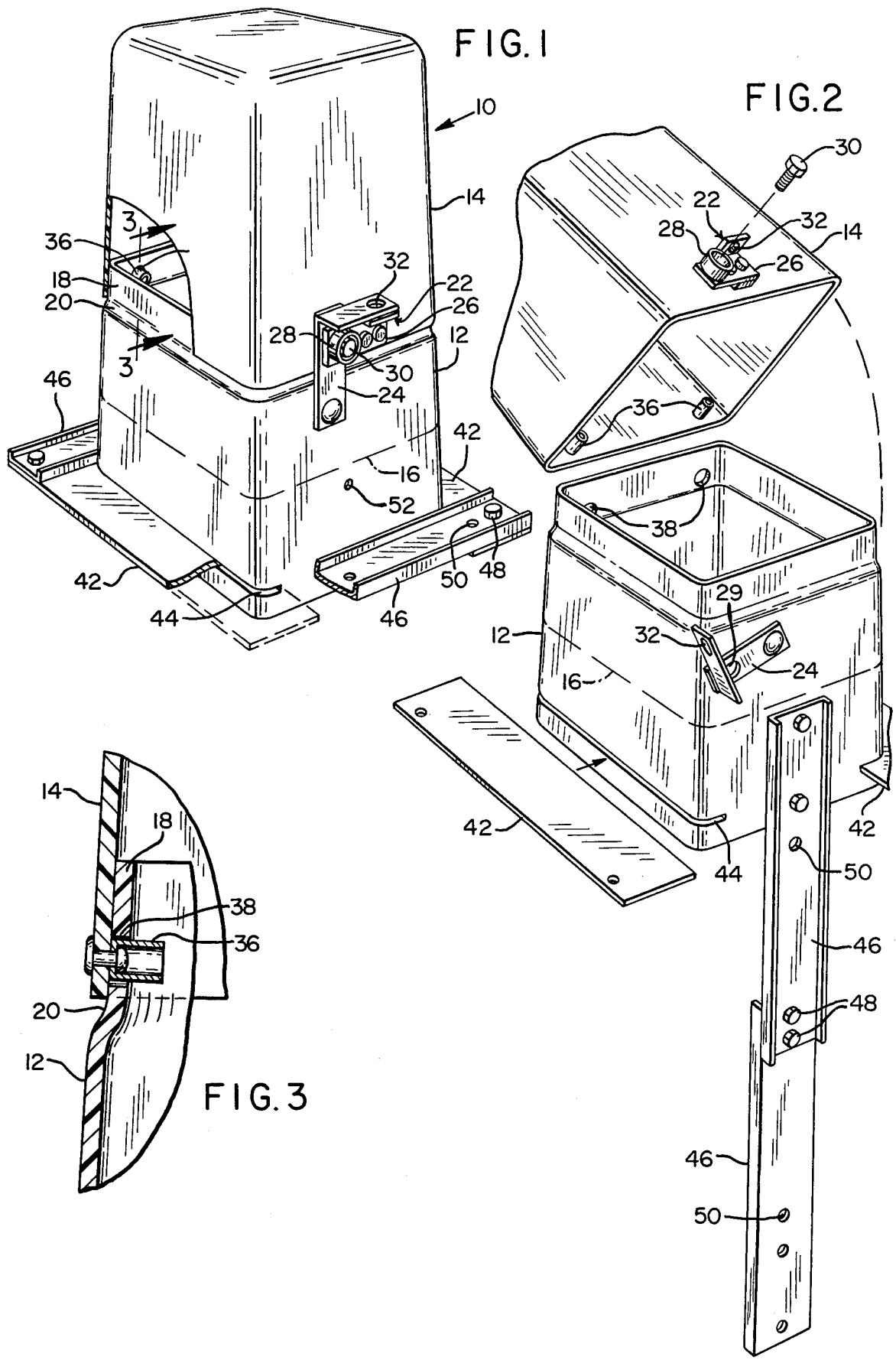

SECONDARY POWER PEDESTAL FOR ELECTRICAL EQUIPMENT

BACKGROUND OF THE INVENTION

This invention relates to new and useful improvements in secondary power pedestals and particularly pertains to a ground supported pedestal.

Ground supported secondary power pedestals for electrical equipment are being used extensively for underground wiring. Such pedestals generally have a lower portion thereof buried in the ground with a bottom outwardly projecting flange serving as an anchor. Such firm anchoring, as well as positive lock means are a necessity since it is desired that the pedestal be substantially tamper-proof by children or other unauthorized persons. Some pedestals, rather than employing a flange type anchor, are anchored in place by a steel stake.

These prior pedestals with the bottom anchor flange arrangement or the stake anchor arrangement have been found to possess some disadvantages. One such disadvantage is that the flanged pedestal due to their irregular shape are bulky to ship, store and handle, adding to the shipping expense and to the difficulties in storage and handling. Such pedestals generally must be palletized and this of course increases shipping and handling costs. A disadvantage of the pedestals of the type using the stake support is that of necessity the stake portion and the housing portion must be shipped and stored in disassembled relation and generally shipped apart from each other. These become separated from each other in shipment and result in inconvenience to the manufacturer, the customer, and the shipper.

SUMMARY OF THE INVENTION

According to the present invention, a pedestal for underground electrical equipment is provided which while maintaining all of the requirements of this type of pedestal has a structure which makes it more convenient and less expensive to ship, store and handle.

Another object is to provide a pedestal of the type described which has a structure providing individual packaging and also packaging of component parts therewith, resulting in an arrangement facilitating installation of the pedestal with either a flanged ground anchor or a stake ground anchor, or both, thus making an extremely versatile assembly.

Another object of the invention is to provide a pedestal which while possessing the above objectives still retains its requirements relating to anchored support and to tamper-proof security.

In carrying out the objectives of the invention, a tubular housing, open at its bottom end, has a removable upper cover. The defining walls of the base member from the bottom open end to an upper portion thereof are substantially straight, namely, they have no bottom flange, and the housing and the cover are tapered to a smaller direction toward the top whereby upon separation of the base member of the housing and the cover, these parts can be nested for packaging in shipment, storage and handling. Separate ground anchor flange pieces for the housing are arranged to be packaged in the same package as the housing and are associated with mounting means between them and the housing for installing them on the housing at the bottom to serve as a ground anchor. Some of the pieces that are packaged with the housing for use as a bottom flange are of a structure that can double in their use as a ground anchor stake so that one or the other types of ground anchors can be employed depending upon the desire of the customer.

The invention will be better understood and additional objects and advantages will become apparent from the following description taken in connection with the accompanying drawings.

BRIEF DESCRIPTION OF THE DRAWINGS

FIG. 1 is a perspective view of a pedestal for underground electrical equipment embodying features of the present invention, this view showing a flange type form of anchor means;

FIG. 2 is a fragmentary assembly view of the pedestal and also showing another anchor form of the invention, namely, a stake anchor form; and FIG. 3 is an enlarged fragmentary sectional view taken on the line 3—3 of FIG. 1.

DETAILED DESCRIPTION OF A PREFERRED EMBODIMENT

With particular reference to the drawings, the pedestal of the invention comprises a tubular housing 10 consisting of a base member 12 and a cover 14. Base member 12 is open at both its upper and lower ends. Cover 14 is fully enclosed except at its bottom end. The housing is arranged to be partly buried in the ground, namely, up to about the phantom line 16 and serves to house various types of electrical equipment connected to underground wiring. The housing is constructed with substantially straight walls from top to bottom, namely, it does not have a bottom flange and is narrowed toward the top in a tapered configuration facilitating nesting of the base member 12 over the cover 14 in a packaged condition for shipping, storing and handling.

In order to provide the nesting feature as well as to provide a tamper-proof structure and one that is easy to assemble, the upper end of base member 12 has an inset portion 18, FIG. 3, in its walls and the bottom end of cover 14 is dimensioned to overlap this inset portion and engage against shoulder 20 formed by the inset portion. A lock mechanism 22 is provided on one side of the housing and comprises a conventional type mechanism such as cooperating hasp and receptacle members 24 and 26 on the base member and cover, respectively. These members may include a threaded socket 28 for a lock bolt 30, such as a "Penta-Bolt" arranged to project into an aperture 29 in hasp 24 to provide a locking connection between members 24 and 26. Such members 24 and 25 may also include cooperating holes 32 for receiving a padlock, not shown. The locking mechanism 22 may include a single one of the locks 32 or a padlock through apertures 32, or both, according to conventional practice and safety regulations.

One of the other walls of the housing, such as the wall opposite from the releasable lock 22, includes structure for holding the cover 14 at this opposite side securely attached to, but removable from the housing. For this purpose, one or more inwardly extending projections 36 are provided on the wall of the cover adjacent the bottom and arranged to project through correspondingly located apertures 38 in the inset portion 18 of the base member 12 in the assembled condition of the base member and cover. Apertures 38 are slightly larger than the projections 36 and such clearance, together with a shortened length of the projections, is such that when the cover is tilted back to a position as shown in FIG. 2, the cover has enough clearance from the base member so that it can be moved relative to the housing to engage the projections with the apertures for assembly or disengage them from the apertures for disassembly. When the cover 14 is mounted on the base member 12, and the lock mechanism 22 engaged with suitable locks, the cover is anchored in place to provide a secured housing. The overlap of the cover on the base member and the inset 18 prevents the penetration of any foreign object into the housing.

Since it is desired that the base member 12 have anchored connection to the ground and also since it is further desired that such base member have straight wall portions at the bottom so that it can be nested with the cover while being shipped, stored or handled, an attachable bottom flange assembly is provided comprising a first pair of strips 42 arranged for insertion edgewise into shallow slots 44 cut horizontally into opposing walls of the base member adjacent the bottom. The flange assembly also includes a second pair of strips 46 arranged to have bolted connection 48 with the strips 42. The strips 42 and 46 have holes 50 therein for receiving the bolts. Strips 42 have a selected length so as to project beyond the walls of the housing for connection to them by the strips 46.

As noted hereinbefore, it may be desired to either support the pedestal in the ground solely by ground anchor means or it may be desired that the pedestal be secured to a vertical stake. In the ground anchor condition thereof, the strips 42 and 46 are assembled on the base member by first inserting the strips 42 in the slots 44 and then bolting the strips 46 thereto as shown in FIG. 1. If it is desired, however, that the pedestal use a ground anchor stake, two or more of the strips 42 or 46 may be used as the stake as shown in FIG. 2. In an effective arrangement, two of the strips, such as the strips 46, are of a length sufficient to form a stake and are constructed of a sturdy material, such as metal, and made in channel form. In addition, the strips 46 have additional holes 50 selectively arranged for either receiving the bolts 48 for connection to the strips as in FIG. 1 or for connection to each other in stake form as in FIG. 2. The housing has holes 52 in its lower portion below the ground line 16 for receiving the bolts 48 when the stake is to be connected to such base member. In the staked form of the pedestal as in FIG. 2, the strips 42 may or may not be used as anchor flanges, such depending upon the desire of the customer. If it is desired that a ground anchor flange be used in addition to the stake, the strips 42 can be placed in the slots 44 and maintained therein by earth fill.

According to the invention, the manufacturer can package the pedestal in nested form in individual packages, and the anchor strips 42 and 46, being of reduced size, can also be placed in such package. If the customer desires a ground anchor flange for the housing, the strips 42 are combined with the housing and the strips 46 as shown in FIG. 1. All four of these strips thus serve as an anchor. If the customer desires to provide a ground anchor stake connection to the housing, the two strips 46 are bolted together in stake form and also bolted to the enclosure. The tapered housing as well as the separate component parts of the anchor allows each pedestal to be neatly packaged as a complete unit with versatile stake-flange arrangement shipped with each pedestal. This packaging capability reduces problems in shipping loss and damage, simplifies warehouse storage, reduces inventory requirement and allows the issuance of a complete power pedestal system in one package.

It is to be understood that the form of my invention herein shown and described is to be taken as a preferred example of the same and that various changes in the shape, size and arrangement of parts may be resorted to without departing from the spirit of my invention, or the scope of the subjoined claims.

Having thus described my invention, I claim:

1. A secondary power pedestal comprising
 (a) a tubular housing having upper and lower ends and defining walls,
 (b) an upper portion of said housing having access means into the interior of said housing,
 (c) said housing having a bottom open end and having a lower portion thereof arranged to be buried in the ground for receiving underground electrical equipment,
 (d) said wall means of said housing being substantially straight from said bottom open end to an upper portion thereof,
 (e) flange means associated with said housing,
 (f) horizontal slots in the lower portion of the walls of said housing arranged to receive said flange means in fitted relation,
 (g) and fastening means for holding said flange means in said slots facilitating use of said flange means as a ground anchor on said lower portion of said housing.

2. The pedestal of claim 1 wherein said horizontal slots are provided in two opposite walls of said housing and said flange means include two flat strip sections arranged to be fitted in said slots and arranged to project at their ends beyond the walls of said housing, said flange means also including connecting strip sections arranged to be secured to the ends of said strip sections and arranged with said flat strip sections to form said ground anchor.

3. The pedestal of claim 2 wherein said connecting strip sections are of a structure facilitating their use as a vertical ground stake whereby to serve in an alternate function as an upright ground stake for said housing instead of as flange means.

4. The pedestal of claim 2 wherein said connecting strip sections comprise a channeled metal construction facilitating their use as a vertical ground stake whereby to serve alternatively as an upright ground stake for said housing instead of as flange means, said connecting strips having cooperating connecting means arranged to secure them substantially in end to end relation to provide an elongated supporting ground stake for said housing.

5. A secondary power pedestal comprising
 (a) a tubular housing having a lower base portion and an upper cover portion releasably connected together providing access to the interior of said housing,
 (b) said housing being tapered to a smaller dimension toward its upper end whereby said base portion is arranged to have a telescoping fit over said cover portion for nesting in shipment and storage,
 (c) said housing having a bottom open end and having a lower portion thereof arranged to be buried in the ground for receiving underground electrical equipment,
 (d) ground anchor means comprising strip sections associated with said housing, (e) and mounting means on said housing facilitating use of said anchor means in a horizontal position adjacent the lower end of said housing to serve as a ground anchor, (f) said anchor means having configuration also facilitating their connection to said housing as a vertical ground stake whereby to serve in an alternate function as an upright ground stake for said housing instead of as a horizontal flange.

* * * * *